United States Patent [19]

Fukada et al.

[11] 4,308,370

[45] Dec. 29, 1981

[54] PIEZOELECTRIC AND PYROELECTRIC POLYMER FILM AND PROCESS FOR PREPARING SAME

[75] Inventors: Eiichi Fukada, Fujimi; Takeo Furukawa, Niiza; Munehiro Date; Toshiaki Takamatsu, both of Tokyo; Ken'ichi Nakamura, Iwaki, all of Japan

[73] Assignees: Rikagauku Kenkyusho, Wako; Kureha Kagaku Kogyo Kabushiki Kaisha, Nihohbashi, both of Japan

[21] Appl. No.: 142,265

[22] Filed: Apr. 21, 1980

[30] Foreign Application Priority Data

Apr. 26, 1979 [JP] Japan .................................. 54-51940

[51] Int. Cl.³ .............................................. B29D 7/20
[52] U.S. Cl. ...................................... 526/255; 264/22

[58] Field of Search .......................... 264/22; 427/100; 428/421; 425/174.8 E; 156/229; 526/255

[56] References Cited

U.S. PATENT DOCUMENTS

| 2,935,418 | 3/1960 | Berthold et al. | 264/22 |
| 3,691,264 | 9/1972 | Asahina | 264/22 |
| 3,931,446 | 1/1976 | Murayama | 427/100 |
| 4,095,020 | 6/1978 | Prist, Jr. et al. | 428/421 |

*Primary Examiner*—James B. Lowe
*Attorney, Agent, or Firm*—Wegner & Bretschneider

[57] ABSTRACT

A process for preparing polyvinylidene fluoride type (PVDF) films having highly stable piezoelectricity and pyroelectricity, by stretching PVDF films, while causing corona discharge, across the electric field formed by discharging, to effect thereby to polarization of film.

9 Claims, 7 Drawing Figures

PIEZOELECTRIC AND PYROELECTRIC POLYMER FILM AND PROCESS FOR PREPARING SAME

This invention concerns piezoelectric and pyroelectric polymeric films prepared by stretching and polarizing a polymeric film, as well as a method of preparing such films.

As is well-known, polymeric materials such as polyvinylidene fluoride, polyvinyl fluoride show piezoelectricity and pyroelectricity when they are made into electrets, for example, by the application of a dc electric field under heating.

In the process of preparing a piezoelectric and pyroelectric film from a polymeric film, steps of stretching the film and applying voltage are required, and these steps are conducted either separately or simultaneously.

While the former, the separate method, has been employed widely and can preparing high polymeric films having high piezoelectricity and pyroelectricity, the piezoelectricity and pyroelectricity thus obtained are unstable as they are reduced with time. On the other hand, piezoelectric and pyroelectric polymeric films obtained by the latter, the simultaneous method, can not provide high piezoelectricity and pyroelectricity, although they are stable.

As for the latter method, such a method is published as Japanese Patent Publication No. 45798/'76 in which a high polymeric film is polarized while stretched in a pair of rolls across which a voltage is applied, but it is difficult to obtain high piezoelectric constant and pyroelectric coefficient in this process since the film is subjected to polarization only at a restricted portion, that is, at the contact point with the rolls, and polarizing time is not sufficient.

Method of stretching a film while closely contacting plate electrodes on both sides of the film and applying a voltage therebetween is also known. No sufficient piezoelectricity and pyroelectricity can, however, be obtained by this method, since if the electrodes are kept in close contact with the film before stretching they can not be kept in this state during stretching.

An object of this invention is to obtain piezoelectric and pyroelectric polymeric films having high and stable piezoelectricity and pyroelectricity.

As is well known, polyvinylidene fluoride (PVDF) takes various crystalline forms including $\alpha$-type, $\beta$-type and $\gamma$-type. PVDF films in the form of the $\beta$-type or the $\gamma$-type are of much usefulness as dielectric materials since the molecule chains have a plannar zig-zag conformation and dipole moments of the unit cell exist in the case of the $\beta$-type and the $\gamma$-type.

The $\beta$-type and the $\gamma$-type are hereinafter referred to collectively as I type although somewhat different from usual meanings.

Such I type crystals can be obtained, for example, by stretching a heat molded sheet and the molphology depends on the method of stretching. According to the definition for crystallographic axes shown by Hasegawa, et al. in Polymer Journal, Vol. 3, No. 5, p. 600–610 (1972), the direction of the molecule chain is taken as axis c, the direction in perpendicular to the axis c and in parallel with the dipoles is taken as axis b and the direction in perpendicular both to the axis c and the axis b is taken as axis a. According to the above definition, the axis c tends to be arranged in the stretching direction when viewed from a film surface but the axis a and the axis b tend to be arranged at random when viewed from the cross section of the film in perpendicular to the stretching direction in a mono-axially stretched film while on the other hand, in a bi-axially oriented film, the axis c tends to be arranged at random when viewed from the film surface but the axis b is arranged in parallel with the film surface and the axis a is arranged in the direction in perpendicular to the film surface when viewed from the cross section of the film. Since the dielectric constant of mono-axially or bi-axially stretched PVDF films comprising the I-Type crystals is in the range of 10 to 13, the dielectric constant of 10 to 13 is 3–4 times as large as that of polyester films, they are utilized as capacitors in portable medical defibrillators and, further, the use of them as capacitors for nuclear fusion devices is considered. So-called double oriented PVDF films composed of the I type crystals in which both of the axis c and the axis b are oriented and, accordingly, the axis a is also oriented have, however, been known only recently. One of them reported in DE-OS 29 30 370 has a feature that the dipoles are oriented in parallel with the film surface. Another report was made in Journal of Applied Physics, Vol. 50, p. 6091–6094, in which the film has a feature that the dipoles are oriented in perpendicular to the film surfaces. The latter film is obtained by the method of stretching and then rolling a film. The report, however, teaches that no desired thickness can be obtained unless the rolling is repeated for several times. Further, the thickness of the film even after such steps is at least about 60$\mu$. By the way, it is desired in the case of the latter film i.e., a piezoelectric film in which dipoles are oriented in perpendicular to the film surface, that the film thickness is as thin as possible since a thicker film is less likely to vibrate as compared with a thinner film of the same substance. In the case of a pyroelectric film, it is also desired to decrease the film thickness since the heat capacitance is increased and sensitive coversion of temperature changes into electric changes is difficult as the film thickness becomes increased.

Another object of this invention is to obtain piezoelectric and pyroelectric polymeric films, in particular, polyvinylidene fluoride (PVDF) films of a thickness below 50$\mu$, preferably, below 40$\mu$ and, more preferably, below 30$\mu$ and having a double-oriented structure in which dipoles are oriented substantially in the direction of the thickness.

This invention provides piezoelectric and pyroelectric polymeric films prepared by disposing a polymeric film between discharging electrodes, and stretching said polymeric film, while causing corona discharge between said electrode, across the electric field formed by said electrode, to effect thereby the polarization of said film. Furthermore it is desired that at least one of said electrodes has a pointed top.

The configuration of the electrode defined as the pointed top in this invention means, for example, needle-like or saw teeth-like shape, and the electrode of such a configuration may be provided at least on one side of the film to be stretched. The electrodes having the pointed top configuration are disposed so that corona discharging may be resulted at least to a portion of the film to be stretched, and the electrodes on one side may be composed of a plurality of electrodes. If the corona discharging is conducted under heating, it is desired to continue the discharging till the film is cooled to some extent after the stretching and the discharging can be conducted also before the stretching.

In the preparing process of this invention, satisfactory results are obtained by satisfying the foregoing conditions and setting the temperature during polarization and stretching preferably below 80° C., more preferably, between room temperature and 70° C. and, much more preferably, between 30°–60° C. Better results can be obtained by setting the temperature higher within the range if the stretching ratio and the stretching speed are great and by setting the temperature lower if the above ratio and speed are small.

The polymeric films usable in this invention are polyvinylidene fluoride type films or sheets, for example, of polyvinylidene fluoride homopolymer, a copolymer consisting of vinylidene fluoride and at least one comonomer copolymerizable therewith, the copolymer containing more than 50 mole percent of vinylidene fluoride units in the main polymer chain, or a composition consisting predominantly of such a homopolymer and/or copolymer. Other materials may be included in the composition.

Said polyvinylidene fluoride type films or sheets nonstretched or stretched may be used in this invention. For example, double-oriented piezoelectric pyroelectric films in which dipoles are oriented substantially in the direction of the thickness can be provided by the process of stretching the stretched films in the vertical direction of said stretching direction, while corona discharging, by this invention.

The PVDF films obtained by the above preparation process can easily be decreased with the thickness below 50μ and mainly consist of the I-type crystals in which dipoles are oriented substantially in the direction of the thickness to form double orientation.

This invention is to be described in more details referring to the accompanying drawings, by which these and other objects, as well as features of this invention will be made clearer, wherein FIG. 1 is a schematic view showing a structure of polyvinylidene fluoride film, which is obtained by the process according to this invention;

Figure 1:
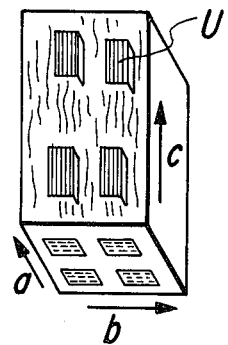

As shown in FIG. 1, PVDF film which is prepared by this invention is a film of double-orientation which essentially comprises of I-type crystal. In FIG. 1, a, b, c corresponds to the axis a, the axis b, and the axis c directions respectively and the axis b is vertical to the film surface.

U means each crystallite.

The ratio of I-type crystal in a given crystal can be judged by infrared absorption spectrum, and the degree of the double orientation can be judged by the wide angle X-ray diffraction photography.

Figure 2:
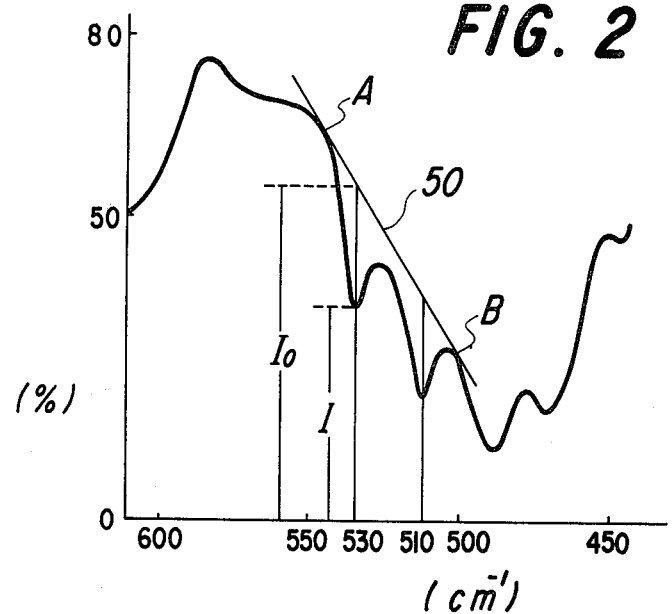
FIG. 2 is a view for infrared absorption spectrum of polyvinylidene fluoride.

Followings are the detail explanation of those judging methods. We take the infrared ray absorption spectrum of a subject crystal. FIG. 2 is an example of this spectrum. In FIG. 2, the vertical axis represents transparent ratio (%) and the horizontal axis represents wave number (cm$^{-1}$). First, we will pick up the absorbance ratio at the 510 cm$^{-1}$ and 530 cm$^{-1}$ shown as $D_{510}$, $D_{530}$ respectively, absorbance at the 510 cm$^{-1}$ corresponds to the absorption by I-type crystal and the absorbance at the 530 cm$^{-1}$ corresponds to the absorption by II-type crystal.

We plot point A at the peak value around 530 cm$^{-1}$, and plot point B at the peak value around 510 cm$^{-1}$. Then we draw a base line 50 from A to B. Absorbances $D_{510}$ and $D_{530}$ are picked up as the difference between base line ($I_0$) and transparent rate (I) at the point of 510 cm$^{-1}$ and 530 cm$^{-1}$ respectively. Using these absorbances, we can calculate the ratio of I-type crystal in a subject crystal by next formula.

Ratio of I-type crystal in subject crystal (%)
$$= \frac{D_{510}}{D_{510} + D_{530}} \times 100$$

The ratio is desirable to be more than 50%, more preferably more than 65%, much more preferably more than 75%.

The orientation mode of the crystals is judged by the wide angle X-ray diffraction photography. The wide angle X-ray diffraction photograph is taken by setting the film cross section, which is cut out in perpendicular to the stretching direction, while placing its width direction vertically and injecting X-ray (CuKα rays) in perpendicular to the film cross section. The crystal orientation mode is judged by whether the diffraction images on the face (200) and face (110) of the I-type crystals form any one of 6-dot images and 6-arcuate images or not.

Figure 3:
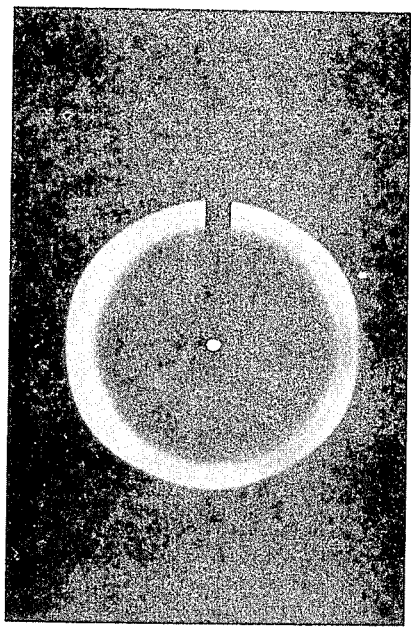
FIG. 3 is a wide angle X-ray diffraction photograph for a piezoelectric and pyroelectric film according to this invention.

As the degree of the double orientation becomes more significant, the 6-dot images are observed more clearly as spot images at 6 points and as the degree of the double orientation becomes insufficient, the 6-dot images are observed to become blurred into 6-arcuate images as shown in FIG. 3.

Figure 4:
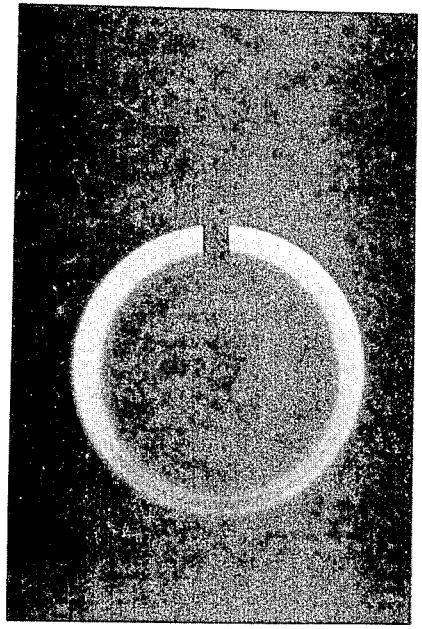
FIG. 4 is a wide angle X-ray diffraction photograph where the axis a and the axis b are oriented at random.

Further, if the axis a and the axis b are oriented at random in the film cross section, ring-like images on a same circle are observed as shown in FIG. 4.

6-arcuate images although somewhat indistinct as shown in FIG. 3 are also within the scope of this invention. That is to say, if the axis b is oriented nearly vertically to the film surface, it is regarded as being substantially oriented vertically. The configuration in FIG. 3 may be seen as a ring if not observed carefully, but it is recognized that the diffraction intensities of the images situated at the top and bottom of the photograph as the arcuate images on the face (200), as well as of the images situated along four oblique directions in the photograph as the arcuate images on the face (110) are apparently greater than those in their vicinity. While on the other hand, it is not recognized in FIG. 4 that the diffraction intensities of the images at such locations are greater than those at other locations, and the two cases can be distinguished apparently from each other.

Then, whether the dipoles are oriented substantially in the direction of the film thickness or not is judged by that if the images on the face (200) are formed as dot images or arcuate images at the top and bottom as shown in FIG. 3. If the images of the face (200) are formed at the right and the left of the photograph, it shows that the dipoles are oriented in parallel with the film surfaces.

EXAMPLE 1

Figure 5:
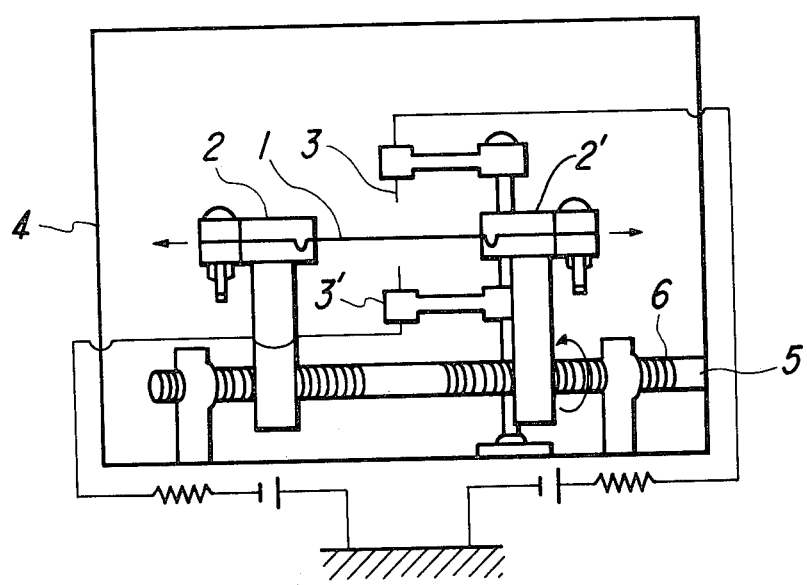
FIG. 5 is a view for one embodiment of the device for carrying out the process of this invention.

An apparatus used for practicing the process of this invention comprises, as shown in FIG. 5, stretching means 2, 2' for pinching film 1 therebetween and stretching it in the direction of an arrow and needle-like electrodes 3, 3' spaced apart each by 1 cm from the both surfaces of the film 1 in a thermostat 4. The stretching means 2, 2' have threads (not shown) for engagement with threads 6 formed around a shaft 5 and are adapted to move horizontally by the rotation of the shaft.

Although the needle-like electrodes 3, 3' are illustrated each by one in the FIG. 5, needles are actually arranged side by side for each surface of the film 1 having 2 cm width, and a positive voltage is applied to the needle-like electrodes 3 and a negative voltage is applied to the needle-like electrodes 3'.

The method of producing piezoelectric and pyroelectric polyvinylidene fluoride films using this apparatus is to be described followingly.

A film 1 of 100μ thickness made of vinylidene fluoride homopolymer or a film of 140μ thickness made of a copolymer consisting of 95% by weight of vinylidene fluoride and 5% by weight of vinyl fluoride was set to the stretching means 2, 2'. The stretching means were operated by the rotation of the shaft to stretch said film by a stretching factor of 4 at a predetermined temperature for 10 min while applying +6 KV to the upper electrode 3 and −6 KV to the lower electrode 3' to thereby produce corona discharging. Since it is unable to stretch the film by a stretching factor of 4 at 25° C. and 30° C., we stretched the film by a respective stretching factor of 3 at 25° C. and 3.7 at 30° C.

When the film was cooled to room temperature after the stretching, the corona discharging was stopped. The piezoelectric and pyroelectric films thus formed and, thereafter, vapor-deposited with silver electrodes were measured for the piezoelectric constant $d_{31}$ for 10 Hz vibration at room temperature and the pyroelectric coefficient $dPs/dT$ at 23° C. The results are shown in Table 1. Table 1 shows the results of the measurements for polyvinylidene fluoride homopolymer and Table 2 shows the results of measurements for copolymer.

TABLE 2

| Polarizing temperature (°C.) | Example $d_{31}$ $(10^{-12} C/N)$ | |
|---|---|---|
| | immediately after | 3 days after |
| 40 | 30 | 24 |
| 60 | 30 | 24 |

While on the other hand, films were previously stretched at 80° C. by a factor of 4 then corona was discharged for the same period of time as in Example 1 by applying +6 KV to the upper electrode 3 and −6 KV to the lower electrode 3' at each of polarizing temperatures of 25° C., 30° C., 40° C., 50° C., 60° C., 70° C., 80° C., 100° C. and 120° C. using the apparatus as shown in FIG. 5. Thereafter, the films were cooled to room temperature. The results are also shown in Table 1 for polyvinylidene fluoride homopolymer and in Table 2 for copolymer (only for examples).

As can be seen from the Tables 1 and 2, the polyvinylidene fluoride homopolymer films obtained by the process of this invention have greater piezoelectric constants and pyroelectric coefficient and are more stable as compared with those obtained by the method of conducting polarization after stretching. Same results are also recognized for the vinylidene fluoride copolymer films.

It will be apparent that while six needles are arranged in one row on one side in the foregoing embodiment, the needle-like electrodes may be arranged in plural rows.

In addition, while the film was stretched by two-directional, i.e., right and leftward tension as show in the figure in the above embodiment, this invention is no way restricted to such a case but a film may be pulled in one direction, for example, between two take-up rolls while generating corona discharging. Such an embodiment is shown below.

EXAMPLE 2

Figure 6:
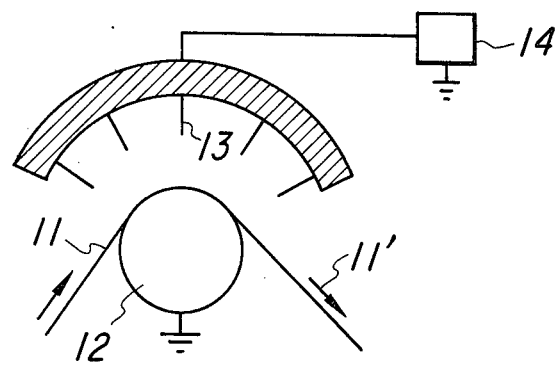
FIG. 6 is a view for a further embodiment of the device for carrying out the process of this invention.

FIG. 6 shows another embodiment for practicing this invention. A film 11 of 60μ thickness made of vinylidene fluoride homopolymer is sent from the left side of the drawing by way of a send roll (not shown) to a heating roll 12 at 10 cm/min then pulled from the heating roll 2 rightwardly by the other take-up roll (not shown) at 40 cm/min and made into a film 11' of 25μ thickness on the right side of the heating roll 12. The

TABLE 1

| | Example (simultaneous stretching and polarization) | | | Comparison Example (stretching at 80° C.) | | |
|---|---|---|---|---|---|---|
| Polarizing temperature (°C.) | $d_{31}$ $(10^{-12} C/N)$ immediately after | 10 days after | $dPs/dT$ $(10^{-9} C/cm^2 \cdot deg)$ | $d_{31}$ $(10^{-12} C/N)$ immediately after | 10 days after | $dPs/dT$ $(10^{-9} C/cm^2 \cdot deg)$ |
| 25 | 30 (stretching × 3) | 27 | 5.4 | 18 | 11 | 2.2 |
| 30 | 35 (stretching × 3.7) | 31 | 6.2 | 18 | 12 | 2.2 |
| 40 | 38 | 35 | 7.3 | 18 | 12 | 2.3 |
| 50 | 40 | 38 | 8.0 | 22 | 14 | 2.6 |
| 60 | 38 | 34 | 7.2 | 25 | 17 | 2.8 |
| 70 | 36 | 31 | 6.3 | 29 | 18 | 3.5 |
| 80 | 35 | 25 | 5.3 | 32 | 20 | 4.1 |
| 100 | 22 | 10 | 2.1 | 24 | 17 | 2.8 |
| 120 | 8 | 5 | 1.1 | 8 | 5 | 0.6 | heating roll 12 has 20 mm diameter and it is grounded to the earth and heated to a surface temperature of 110° C. Five needle-like electrodes 13 with appropriate needle pitch are disposed toward the center of the heating roll 12 while spaced apart from the surface of the heating roll 12 by 8 mm, and 8 KV voltage is applied between the needle-like electrodes and the roll surface by a high voltage DC power supply 14. The films prepared by this method and, thereafter, vapor-deposited with aluminum electrodes on both surfaces thereof were measured for the piezoelectric constant $d_{31}$ as in Example 1. The piezoelectric constant $d_{31}$ was $32 \times 10^{-12}$ C/N immediately after the preparation and $28 \times 10^{-12}$ C/N even one month after.

EXAMPLE 3

Figure 7:
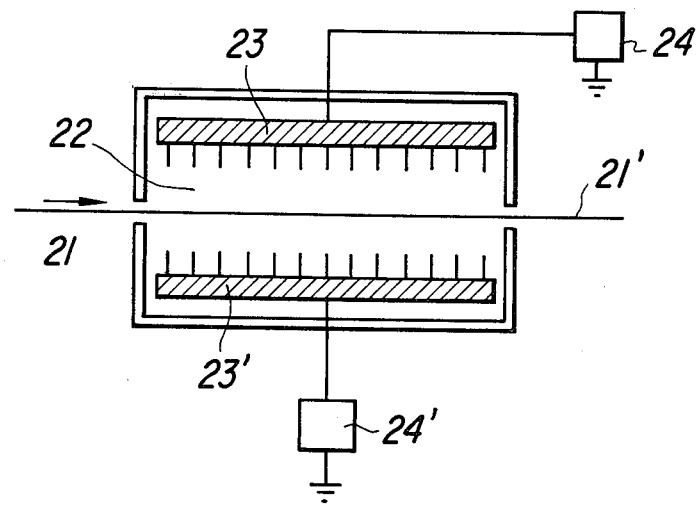
FIG. 7 is a view for a still further enbodiment of the device for carrying out the process of this invention.

FIG. 7 shows a further apparatus for practicing this invention. A film 21 of $100\mu$ thickness made of vinylidene fluoride homopolymer is sent from the left in the drawing by a send roll (not shown) to a temperature control bath 22 at 10 cm/min and then stretched from the control bath 22 rightwardly at 40 cm/min by the other roll (not shown) and made into a film 21' of $33\mu$ thickness at the right of the temperature control bath 22 in the drawing. The temperature control bath 22 is controlled to 45° C. and necking stretching was conducted in the temperature control bath 22. Needle electrode groups 23, 23' are provided spaced apart each by 1 cm from above and below the films 21 and 21' and +6 KV is applied to the needle electrode 23 and −6 KV is applied to the needle electrode 23' respectively from high voltage DC power supply 24, 24' during stretching. The films prepared in this way were vapor-deposited with aluminum electrodes on both surfaces thereof and measured for the piezoelectric constant $d_{31}$ as in Example 1. The constant was $35 \times 10^{-12}$ C/N immediately after the preparation and $31 \times 10^{-12}$ C/N even one month after. The ratio of the I-type crystal in the crystal system of the stretched films was 70% when measured through infrared absorption and the crystal orientation mode was as shown in FIG. 3. For the comparison, when films were treated in the same manner as in Example 3 excepting for conducting the polarization after the stretching previously conducted, the piezoelectric constant $d_{31}$ was $27 \times 10^{-12}$ C/N just after the preparation and $19 \times 10^{-12}$ C/N after one month. The ratio of the I-type crystal in the crystal system of the stretched films was 75% and the crystal orientation mode was as shown in FIG. 4.

As can be seen from the foregoing embodiments, since the films according to this invention are polarized under electric field, they can be used as they are as piezoelectric films or pyroelectric films. They have high piezoelectric constant and pyroelectric coefficient as well as are stable and can be prepared with ease as thin films. Accordingly, they can be used as they are in the application uses where conventional piezoelectric films or pyroelectric films are usable.

Furthermore, since the dipoles are oriented in specific direction, the films according to this invention are excellent also in photoelectric effects and are industrially useful being usable to broad applications in electric materials.

What is claimed is:

1. A process for preparing a piezoelectric pyroelectric film or highpolymer comprising stretching a polyvinylidene fluoride type film, disposed between the electrodes for discharge, while causing corona discharge between said electrodes, across the electric field formed by said discharge, to effect thereby the polarization of said polymeric film.

2. The process as defined in claim 1, wherein at least one of said electrodes comprises electrode having a pointed top.

3. The process as defined in claim 2, wherein each of the electrodes comprises an electrode having a configuration of a pointed top.

4. The process as defined in claim 3, wherein a positive voltage is applied to one of said electrodes and a negative voltage is applied to the other of said electrodes.

5. The process as defined in any one of claims 1 to 4, wherein the treating temperature in said stretching and polarizing steps is below 80° C.

6. The process as defined in any one of claims 1 to 4, wherein the treating temperature in said stretching and polarizing steps is below 70° C. and above room temperature.

7. The process as defined in any one of claims 1 to 4, wherein the treating temperature in said stretching and polarizing steps is between 30° C. and 60° C.

8. The process as defined in any one of claims 1 to 4, wherein said polymeric film is a polymeric film essentially comprising of polyvinylidene fluoride.

9. A piezoelectric pyroelectric polymeric film prepared by disposing a polyvinylidene fluoride type film between discharging electrodes at least one of which comprising electrode having a configuration of a pointed top, stretching said polymeric film in transverse to an electric field resulted by continuing corona discharging generated between said electrodes.

* * * * *

UNITED STATES PATENT AND TRADEMARK OFFICE
CERTIFICATE OF CORRECTION

PATENT NO. : 4,308,370

DATED : December 29, 1981

INVENTOR(S) : Eiichi FUKADA ET AL

It is certified that error appears in the above—identified patent and that said Letters Patent is hereby corrected as shown below:

Claim 1, line 2, after "film" change "or" to

--of--

Signed and Sealed this

First Day of June 1982

[SEAL]

Attest:

Attesting Officer

GERALD J. MOSSINGHOFF

Commissioner of Patents and Trademarks